United States Patent
Fareed et al.

(10) Patent No.: US 8,541,817 B2
(45) Date of Patent: Sep. 24, 2013

(54) MULTILAYER BARRIER III-NITRIDE TRANSISTOR FOR HIGH VOLTAGE ELECTRONICS

(75) Inventors: Qhalid Fareed, Irmo, SC (US); Vinod Adivarahan, Columbia, SC (US); Asif Khan, Irmo, SC (US)

(73) Assignee: Nitek, Inc., Irmo, SC (US)

(*) Notice: Subject to any disclaimer, the term of this patent is extended or adjusted under 35 U.S.C. 154(b) by 501 days.

(21) Appl. No.: 12/941,332

(22) Filed: Nov. 8, 2010

(65) Prior Publication Data

US 2011/0108887 A1 May 12, 2011

Related U.S. Application Data

(60) Provisional application No. 61/272,819, filed on Nov. 6, 2009.

(51) Int. Cl.
*H01L 29/66* (2006.01)

(52) U.S. Cl.
USPC .............. 257/194; 257/E29.246; 257/E21.403

(58) Field of Classification Search
USPC ............................ 257/194, E29.246, E21.403
See application file for complete search history.

(56) References Cited

U.S. PATENT DOCUMENTS

| | | | |
|---|---|---|---|
| 7,777,252 B2 | 8/2010 | Sugimoto et al. | |
| 7,794,541 B2 | 9/2010 | Shibata et al. | |
| 7,795,642 B2 * | 9/2010 | Suh et al. | 257/194 |
| 7,800,132 B2 | 9/2010 | Smorchkova et al. | |
| 7,800,133 B2 * | 9/2010 | Kanamura et al. | 257/194 |

OTHER PUBLICATIONS

Pulsed Metalorganic Chemical Vapor Deposition of High Quality AlN/GaN Superlattices for Intersubband Transistions, Proc. of SPIE vol. 7222, 722212-7, Bayram et al. 2009.

* cited by examiner

*Primary Examiner* — Marcos D. Pizarro
*Assistant Examiner* — Bilkis Jahan
(74) *Attorney, Agent, or Firm* — Michael A. Mann; Nexsen Pruet, LLC

(57) ABSTRACT

An improved high breakdown voltage semiconductor device and method for manufacturing is provided. The device has a substrate and a $Al_aGa_{1-a}N$ layer on the substrate wherein $0.1 \leq a \leq 1.00$. A GaN layer is on the $Al_aGa_{1-a}N$ layer. An $In_{1-b}Ga_bN/GaN$ channel layer is on the GaN layer wherein $0.1 \leq b \leq 1.00$. A $Al_cIn_dGa_{1-c-d}N$ spacer layer is on the $In_{1-b}Ga_bN/GaN$ layer wherein $0.1 \leq c \leq 1.00$ and $0.0 \leq d \leq 0.99$. A $Al_eIn_{1-e}N$ nested superlattice barrier layer is on the $Al_cIn_dGa_{1-c-d}N$ spacer layer wherein $0.10 \leq e \leq 0.99$. A $Al_fIn_gGa_{1-f-g}N$ leakage suppression layer is on the $Al_eIn_{1-e}N$ barrier layer wherein $0.1 \leq f \leq 0.99$ and $0.1 \leq g \leq 0.99$ wherein the leakage suppression layer decreases leakage current and increases breakdown voltage during high voltage operation. A superstructure, preferably with metallic electrodes, is on the $Al_fIn_gGa_{1-f-g}N$ leakage suppression layer.

73 Claims, 2 Drawing Sheets

MULTILAYER BARRIER III-NITRIDE TRANSISTOR FOR HIGH VOLTAGE ELECTRONICS

CROSS-REFERENCE TO RELATED APPLICATIONS

The present application claims priority to pending U.S. Provisional Patent Appl. No. 61/272,819 filed Nov. 6, 2009.

GOVERNMENT RIGHTS

The United States Government has certain rights in this invention pursuant to contract No. HQ0147-09-C-7144 awarded by the Missile Defense Agency.

BACKGROUND

The present application is related to a low leakage group III-nitride semiconductor structure which is ideally suited for use in high voltage, high frequency or high temperature electronic devices. More specifically, the present invention is related to an aluminum indium nitride and aluminum indium gallium nitride semiconductor device which has low leakage and improved properties.

Group III nitrides have attracted a significant amount of attention for use in a variety of semiconductor applications due, in part, to their wide and direct band gaps. Devices utilizing group III nitrides enjoy a relatively high break down voltage and a high saturated electron mobility.

Group III-Nitride based High Electron Mobility Transistors (HEMT), show tremendous promise as switching elements for power electronic applications. The key requirements for high power switches include high breakdown voltages ($V_{BR}$), minimum conduction and switching losses and high switching frequency which allows them to cope with modern trends in power converter-inverter, design and to allow monolithically integrated power converter technology.

One of the widely known Group III-nitride HEMTs are based on a heterostructures comprising GaN and AlGaN. One difficulty with group III nitrides is the lattice mismatch and resulting lattice strain which deteriorates the device performance and longevity.

The most important physical device dimension which governs the breakdown voltage in Group III nitride HEMTs is the gate-drain spacing $L_{GD}$ where most of the voltage drops in the pinch-off device condition. The challenge of achieving high breakdown voltage $V_{BR}$ with a minimum on-resistance $R_{ON}$ translates into an optimal field profile in the gate-drain region so that it is able to sustain the highest possible voltage at the lowest $L_{GD}$ value.

An ideal switching will block infinite voltage when OFF and pass infinite current when ON with no voltage drop across it. In other words, the switch has zero resistance when ON and infinite resistance when OFF. In reality, an ideal switch performance can never be achieved by a practical power semiconductor switch. However, the aim of the power semiconductor have been to achieve a device with as low as a resistance as possible when in ON state called "ON resistance" ($R_{ON}$) of the device for the given maximum voltage it can block in OFF state know as "breakdown voltage" ($V_{BR}$) of the device.

Another major factor that limits the performance and reliability of III-nitride HEMT technology for high frequency, high power and high breakdown voltage applications is their relatively high gate leakage currents. The gate leakage reduces the breakdown voltage. It also reduces the power added efficiency and increases the noise to signal ratio.

Initially AlGaN/GaN HEMTs have faced many problems in solving these issues. One of the solutions was to make insulated gate devices which have gate-leakage currents which are several orders lower than Schottky-gate HEMTs. This makes them attractive candidates as a building block for the AlGaN based power converters. However, the associated processes may not be available for low cost and high yield manufacture.

Ternary and quaternary group III nitrides comprising indium have attracted much attention due to the possibility of improved lattice matching with gallium nitride. Implementation of these materials has been complicated by the large band offsets and abrupt changes in properties including band gap, refractive index and chemical reactivity at the interface between AlInN and GaN. Near lattice matched AlInN/GaN heterostructures have been demonstrated for use in AlInN Bragg reflectors, microcavities and transistors.

AlInN alloys have been considered to be candidates for optoelectronic devices covering an extremely wide spectral range from deep UV to infrared due to the large band gap range of 6.2 eV for AlN to 0.7 eV for InN. Unfortunately, growth of AlInN over the full compositional range has been thwarted by problems associated with phase separation during epitaxial growth due, in part, to the large disparity in cation sizes and the differences in thermal properties of the binary constituents. Because of this lattice matching of $Al_{0.83}In_{0.17}N/GaN$, the heterostructure interface minimizes strain which minimizes cracking and/or dislocation formation.

In replacing AlGaN barrier layer with AlInN, HEMTs in turn offer higher sheet charge densities because of the higher spontaneous polarization of AlInN compared with AlGaN.

There has been a long felt need in the art for improved semiconductor structures based on group III nitrides. However, the difficulties associated with the materials have limited the opportunities.

SUMMARY

It is an object of the invention to provide an improved semiconductor material which is ideally suited for use in high temperature, high frequency and high voltage devices.

It is another object to provide an improved multi-layered transistor which incorporates the advantages offered by indium incorporation in a group III nitride structure.

It is another object to provide a leakage suppressing layer over a multilayer barrier structure.

It is another object to provide an superlattice based barrier layer with controlled composition and thickness These and other advantages, as will be realized, are provided in a high breakdown voltage semiconductor device. The device has a substrate and a $Al_aGa_{1-a}N$ layer on the substrate wherein $0.1 \leq a \leq 1.00$. A GaN layer is on the $Al_aGa_{1-a}N$ layer. An $In_{1-b}Ga_bN/GaN$ channel layer is on the GaN layer wherein $0.1 \leq b \leq 1.00$. A $Al_cIn_dGa_{1-c-d}N$ spacer layer is on the $In_{1-b}Ga_bN/GaN$ layer wherein $0.1 \leq c \leq 1.00$ and $0.0 \leq d \leq 0.99$. A $Al_eIn_{1-e}N$ nested superlattice barrier layer is on the $Al_cIn_dGa_{1-c-d}N$ spacer layer wherein $0.10 \leq e \leq 0.99$. A $Al_fIn_gGa_{1-f-g}N$ leakage suppression layer is on the $Al_eIn_{1-e}N$ barrier layer wherein $0.1 \leq f \leq 0.99$ and $0.1 \leq g \leq 0.99$ wherein the leakage suppression layer decreases leakage current and increases breakdown voltage during high voltage operation. A superstructure, preferably with metallic electrodes, is on the $Al_fIn_gGa_{1-f-g}N$ leakage suppression layer.

Yet another embodiment is provided by a method for forming a semiconductor device. The method includes the steps of:
providing a substrate;
depositing a $Al_aGa_{1-a}N$ layer on the substrate wherein $0.1 \leq a \leq 1.00$; depositing a GaN layer on the $Al_aGa_{1-a}N$ layer; depositing a $In_{1-b}Ga_bN/GaN$ channel layer on the GaN layer wherein $0.1 \leq b \leq 1.00$;
depositing a $Al_cIn_dGa_{1-c-d}N$ spacer layer on the $In_{1-b}Ga_bN/GaN$ layer wherein $0.1 \leq c \leq 1.00$ and $0 \leq d \leq 0.99$;
depositing a $Al_eIn_{1-e}N$ nested superlattice barrier layer on the $Al_cIn_dGa_{1-c-d}N$ spacer layer wherein $0.10 \leq e \leq 0.99$;
depositing a $Al_fIn_gGa_{1-f-g}N$ leakage suppression layer on the $Al_eIn_{1-e}N$ barrier layer wherein $0.1 \leq f \leq 0.99$ and $0.1 \leq g \leq 0.99$; and
depositing at least one layer selected from the $Al_aGa_{1-a}N$ layer; the GaN layer, the $In_{1-b}Ga_bN/GaN$ channel layer; the $Al_eIn_{1-e}N$ nested superlattice barrier layer and the $Al_fIn_gGa_{1-f-g}N$ leakage suppression layer by a pulsed metalorganic chemical vapor deposition technique.

DESCRIPTION

The present invention is directed to achieving high breakdown voltages and low leakage current in an improved group III-nitride transistor with multiple layers. More specifically, the present application is specific to a group III-nitride transistor utilizing indium wherein the problems associated with electron accumulation on the surface are mitigated. The transistor is particularly well suited for use in high electron mobility transistors and, more particularly, suitable for high break down voltage and high frequency devices.

Various embodiments will be described with reference to the figures which are included herewith. The figures are an integral non-limiting part of the disclosure. Throughout the various figures similar elements will be numbered accordingly.

Figure 1:
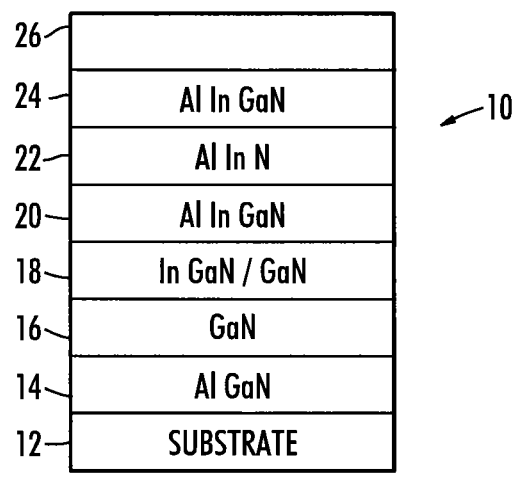
FIG. 1 is a schematic cross-sectional view of an embodiment of the invention.

An embodiment of the invention will be described with reference to FIG. 1 which is a schematic cross-sectional view of an embodiment of the invention. In FIG. 1, the device generally represented at 10, comprises a substrate, 12. Coated on the substrate, 12, is an $Al_aGa_{1-a}N$ layer, 14. A GaN layer, 16, is coated on the $Al_aGa_{1-a}N$ layer thereby forming a first heterojunction. An $In_{1-b}Ga_bN/GaN$ channel layer, 18, is formed on the GaN layer. An $Al_cIn_dGa_{1-c-d}N$ spacer layer, 20, is formed on the $In_{1-b}Ga_bN/GaN$ layer. An $Al_eIn_{1-e}N$ nested superlattice barrier layer, 22, is formed on the $Al_cIn_dGa_{1-c-d}N$ spacer layer. An $Al_fIn_gGa_{1-f-g}N$ leakage suppression layer, 24, is formed on the $Al_eIn_{1-e}N$ barrier layer. A superstructure, 26, is formed on the $Al_fIn_gGa_{1-f-g}N$ leakage suppression layer. For simplicity the subscripts are not included in the figures.

Although preferably made of sapphire, the substrate may be made of silicon carbide, GaN, AlN, AlGaN, InN, InGaN, AlInGaN, Silicon, GaAs, $LiAlO_3$, $LiGaO_3$, ZnO, or a metal. In addition, the preferred substrate has a crystallographic orientation along the C-plane, A-plane, M-plane or R-plane and has a mis-orientation ranging from 0.0° to 10° from its axis. The substrate preferably has a root mean square roughness ranging from 1 Å to 100 micron.

The $Al_aGa_{1-a}N$ layer, wherein $0.1 \leq a \leq 1.00$ and more preferably $0.90 \leq a \leq 1.00$, is formed at a coating thickness of at least 10 Å to no more than 10 μm. Below a thickness of about 10 Å the defects increase and cracking occurs. Above about 10 μm no additional benefit are realized. More preferably, the thickness is 100 Å-2.0 μm, The $Al_aGa_{1-a}N$ layer functions as a buffer layer between the substrate and GaN layer thereby mitigating defect propagation. The $Al_aGa_{1-a}N$ layer is preferably formed by metal-organic chemical vapor deposition methods, which may be pulsed, with other methods being suitable for demonstration of the invention. The $Al_aGa_{1-a}N$ layer is preferably undoped.

The GaN layer and $Al_aGa_{1-a}N$ layer form a first heterojunction. The GaN layer is formed, preferably by metal-organic chemical vapor deposition techniques, which may be pulsed, at a coating thickness of at least 10 Å to no more than 10 μm. Below about 10 Å the defects are too high. Above about 10 μm no additional benefit is observed. Other techniques can be used to form the coating.

The $In_{1-b}Ga_bN/GaN$ channel layer wherein $0.1 \leq b \leq 1.00$ provides a deep quantum well and assist in confining the polarization based charges in the quantum well thereby increasing both the two dimensional electron gas mobility and the sheet carrier density. The $In_{1-b}Ga_bN/GaN$ channel layer is preferably deposited by metal-organic chemical vapor deposition techniques, which can be pulsed, with other techniques being suitable for demonstration of the invention. The $In_{1-b}Ga_bN/GaN$ channel layer has a thickness of 10 Å to 1000 Å. The $In_{1-b}Ga_bN/GaN$ layer is a either a single layer, a graded layer or a step graded layer.

The $Al_cIn_dGa_{1-c-d}N$ spacer layer wherein $0.1 \leq c \leq 1.00$ and $0 \leq d \leq 0.99$ provides for a smooth surface as a transition between the channel layer and subsequent barrier layer. More preferably, $0.90 \leq c \leq 1.00$ and $0 \leq d \leq 0.10$. The spacer layer is controlled to a thickness of at least 5 Å to no more than 100 Å, and more preferably 5 Å to 50 Å and even more preferably 10 Å to 20 Å. The spacer layer is preferably deposited by a pulsed metalorganic chemical vapor deposition method wherein the thickness is precisely controlled by controlling the number of pulses of precursor. Pulsed metalorganic chemical vapor deposition reduces the alloy related interface roughness.

A particular advantage of the spacer layer is the improvement in electron mobility. With the instant invention a sheet resistance of 10-1000 ohm/sq can be obtained. More preferably the sheet resistance is less than 250 ohm/sq. The electron mobility is at least 300 cm$^2$/vs to 3000 cm$^2$/vs and preferably no more than 1200 cm$^2$/vs. The sheet carrier density is preferably 0.1 to $4.0 \times 10^{-13}$ cm$^{-2}$ and preferably higher than $2.0 \times 10^{13}$ cm$^{-2}$.

The $Al_eIn_{1-e}N$ nested superlattice barrier layer wherein $0.10 \leq e \leq 0.99$, and more preferably $0.65 \leq e \leq 0.99$, has a thickness of at least 1 Å to no more than 1000 Å. Below about 1 Å the barrier characteristics diminish and above about 1000 Å there is small benefit offered. More preferably, the barrier layer has a thickness of 30 Å to 300 Å. The $Al_eIn_{1-e}N$ barrier layer is deposited by pulsed metalorganic chemical vapor deposition.

The nested superlattice barrier layer forms a transitional composition between a first layer coated on the spacer layer and the n$^{th}$ layer upon which the leakage suppression layer is formed. Each layer of the nested superlattice barrier layer has a composition of $Al_eIn_{1-e}N$ nested superlattice barrier layer wherein $0.10 \leq e \leq 0.99$. The nested superlattice barrier layer may comprise sublayers. The sublayers represent step changes in composition with subsequent sublayers representing a different Al/In ratio relative to the previous layer. Within each sublayer the Al/In ratio may remain constant or it may increase with distance from the substrate. By way of example, a specific sublayer may have a constant composition such as $Al_zIn_{1-z}N$ with z=0.1. The subsequent sublayer may then have a constant composition such as $Al_zIn_{1-z}N$ with z=0.15 with continuing layers applied having sequentially increased In levels until the desired composition is reached thereby forming stepped concentrations. The Al concentration changes between successive layers may be constant or varied with distance from the substrate. In another embodiment, each layer may have an initial composition with increasing concentration of Al, or In, through the sublayer thereby forming graded steps. For example, a specific sublayer may have an initial composition such as $Al_{1-z}Ga_zN$ with z=0.1 and a final composition of $Al_zIn_{1-z}N$ with z=0.125 with a continuous composition gradient there between. The subsequent sublayer may then have an initial composition of $Al_zIn_{1-z}N$ with z=0.15 and a final composition of $Al_zIn_{1-z}N$ with z=0.175. In each case, the superlattice has a composition gradient which mimics a continuous gradient.

In a particularly preferred embodiment the $Al_eIn_{1-e}N$ layer is a nested superlattice barrier layer comprising alternating AlN/InN superlattice layers wherein the thickness of each AlN layer is 1 Å to 500 Å and each InN layer is 1 Å to 500 Å. Furthermore, the $Al_eIn_{1-e}N$ layer can be a nested superlattice barrier layer comprising Al/N/In/N individually or multistacks of Al/N/In/N atomic layers wherein the thickness of each layer is 1 Å-20 Å.

The $Al_fIn_gGa_{1-f-g}N$ leakage suppression layer wherein $0.1 \leq f \leq 0.99$ and $0.1 \leq g \leq 0.99$ mitigates current leakage at surface traps. In conventional AlGaN/GaN and AlInN/GaN devices the current leakage to surface traps degrades the performance. This is particularly a problem in AlInN/GaN HEMT structures which have high surface traps due to the high indium segregation, oxidation and localized defects caused by low growth temperature. The leakage suppression layer has a thickness ranging from at least 1 Å to no more than 200 Å. Below about 1 Å the advantages diminish. Above about 200 Å the advantages are no longer enhanced. The $Al_fIn_gGa_{1-f-g}N$ leakage suppression layer is deposited by pulsed metalorganic chemical vapor deposition. In a particularly preferred embodiment the leakage suppression layer is a single layer or multistack of at least one of AlN, GaN, AlGaN, InGaN, AlInGaN or AlGaN. The leakage suppression layer is preferably either undoped or doped with silicon.

The superstructure is preferably a field plate geometry device which provides field effect properties. Particularly preferred transistors include HEMTs' such as metal-insulator-semiconductor (MIS-HEMT) or metal-oxide-semiconductor (MOS-HEMT), insulated gate bipolar transistor (IGBT) and the like.

The breakdown voltage of the semiconductor device is preferably 300 V to 100 KV.

Figures 2, 3:
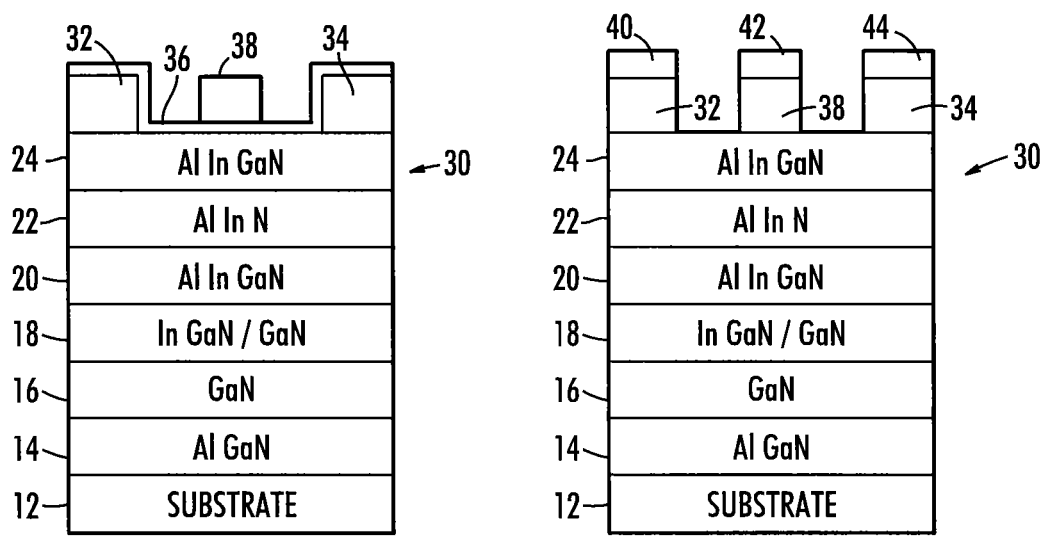
FIG. 2 is a schematic cross-sectional view of an embodiment of the invention.
FIG. 3 is a schematic cross-sectional view of an embodiment of the invention.

An embodiment of the invention is illustrated in schematic cross-sectional view in FIG. 2 wherein the superstructure is an insulated high electron mobility transistor. In FIG. 2 the device, generally represented at 30, comprises a substrate, 12, with a $Al_aGa_{1-a}N$ layer, 14, on the substrate. A GaN layer, 16, is on the $Al_aGa_{1-a}N$ layer. An $In_{1-b}Ga_bN$/GaN channel layer, 18, is on the GaN layer. An $Al_cIn_dGa_{1-c-d}N$ spacer layer, 20, is on the $In_{1-b}Ga_bN$/GaN layer. An $Al_eIn_{1-e}N$ barrier layer, 22, is on the $Al_cIn_dGa_{1-c-d}N$ spacer layer. An $Al_fIn_gGa_{1-f-g}N$ leakage suppression layer, 24, is formed on the $Al_eIn_{1-e}N$ barrier layer. Layers 12, 14, 16, 18, 20, 22 and 24 are as described relative to FIG. 1. The superstructure, comprises a source, 32, and drain, 34, with an functional layer, 36, thereon. A gate, 38, is on the functional layer, 36. The functional layer can be an insulator or a dielectric. In a preferred embodiment the functional layer is a high dielectric insulator with a dielectric strength of at least 1 MV/m. It is preferable that the dielectric strength of the functional layer be no more than 100 MV/m. The functional layer preferably comprises at least one material selected from silicon dioxide, silicon nitride, benzocyclobutene, aluminium nitride, aluminum galium nitride, galium nitride, boron nitride, silicon carbide, diamond, aluminum oxide, magnesium oxide, hafnium oxide, zirconium oxide, scandium oxide, polytetrafluoroethylene, perfluoroalkoxy, fluorinated ethylene propylene, polystyrene, polyoxybenzylmethylenglycolanhydride, or combinations thereof.

An embodiment of the invention is illustrated in schematic cross-sectional view in FIG. 3 wherein the superstructure is a high electron mobility transistor. In FIG. 3 the device, generally represented at 30, comprises a substrate, 12, with a $Al_aGa_{1-a}N$ layer, 14, on the substrate. A GaN layer, 16, is on the $Al_aGa_{1-a}N$ layer. An $In_{1-b}Ga_bN$/GaN channel layer, 18, is on the GaN layer. An $Al_cIn_dGa_{1-c-d}N$ spacer layer, 20, is on the $In_{1-b}Ga_bN$/GaN layer. An $Al_eIn_{1-e}N$ barrier layer, 22, is on the $Al_cIn_dGa_{1-c-d}N$ spacer layer. An $Al_fIn_gGa_{1-f-g}N$ leakage suppression layer, 24, is formed on the $Al_eIn_{1-e}N$ barrier layer. Layers 12, 14, 16, 18, 20, 22 and 24 are as described relative to FIG. 1. The superstructure, comprises a source, 32, and drain, 34, and a gate, 38. A field plate, 40 42 and 44, is on at least one of the source, drain or gate electrode.

Pulsed metalorganic chemical vapor deposition provides metalorganic materials and ammonia wherein one, or both, of the flows are intermittently terminated. The systematic pulsing of either the metalorganic or the nitrogen source provides a fast transition between subsequent layers and well ordered interfaces.

Each of the $Al_aGa_{1-a}N$ layer, GaN layer, $In_{1-b}Ga_bN$/GaN, $Al_cIn_dGa_{1-c-d}N$ and $Al_fIn_gGa_{1-f-g}N$ leakage suppression layer can be formed by at least one technique selected from metalorganic chemical vapor deposition, hydride vapor phase epitaxy, pulsed atomic layer epitaxy, rapid pulsed lateral overgrowth epitaxy, metalorganic hydride vapor phase epitaxy, molecular beam epitaxy or flow modulation technique and similar methods.

The precursors for the layers are organometallics and preferably the methyl derivative such as trimethylaluminum, trimethylgallium and trimethylindium. Larger molecular weight organometallics can be used but the trimethylmetallic is most preferred due to the molecular weight.

Pulsed metalorganic chemical vapor deposition allows for a temporal separation of metallorganic and nitrogen source. By introducing the group III and group V precursors in an alternating sequence growth efficiency is maximized and parasitic reactions are minimized.

In one method of depositing the AlInN nested superlattice barrier layer, an Group III nitride precursor flows for 0 to 30 secs followed by an ammonia and Group III precursors flowing for 0-240 secs. For example, an AlN is deposited with an Al flow followed by Al and ammonia flow. The first sublayer of AlInN is followed by Al and indium precursor flow followed by Al, indium and ammonia flow. This leads to formation of second sublayer of AlInN. A nested superlattice is formed by depositing a first AlN sub layer following the first superlattice of InN and AlInN. The composition is adjusted such that the thick nested superlattice layer is within the cracking limit due to strain.

In a second method depositing nested superlattice, ammonia flows for 0 to 30 secs. followed by ammonia and Group III precursors flowing for 0-240 secs. For example, an AlN is deposited with an ammonia flow followed by Al and ammonia flow. The first sublayer of AlInN is followed by ammonia precursor flow followed by an Al, indium and ammonia flow. This leads to formation of a second sublayer of AlInN. The composition is adjusted such that the thick nested superlattice layer is within the cracking limit due to strain.

In another method of forming $Al_fIn_gGa_{1-f-g}N$ leakage suppression layer, a Group III nitride precursor flows for 0 to 60 secs followed by an ammonia and Group III precursors flowing for 0-240 secs. For example, AlN is deposited with an Al flow followed by Al and ammonia flow. The first sublayer of AlInN is followed by Al and indium precursor followed by Al, Ga and ammonia flow. This leads to formation of a second sublayer of $Al_mGa_nN$. Then the third step is deposition of a third $Al_pGa_qN$ sub layer by flowing Al and Ga in the first step and Al, Ga and ammonia in the next step. The first superlattice is formed repeating the $Al_mGa_nN$ and $Al_pGa_qN$ for one time or multiple times. A nested superlattice is formed by depositing a first AlN sub layer following the first superlattice of $Al_mGa_nN$ and $Al_pGa_qN$. The composition of Al and Ga in $Al_mGa_nN$ and Al and Ga in $Al_pGa_qN$ is constantly changed up to forming $Al_fIn_gGa_{1-f-g}N$ leakage suppression layer. The composition is adjusted such that the layer is within the cracking limit due to strain.

In another method of forming a forming $Al_fIn_gGa_{1-f-g}N$ leakage suppression layer, a Group III nitride precursor flows for 0 to 60 secs followed by ammonia and Group III precursors flowing for 0-240 secs. For example, an $Al_aIn_bGa_{1-a-b}N$ is deposited with an Al, Ga and In flow followed by Al, Ga, In and ammonia flow. The first sublayer of AlInGaN is followed by Al, Ga, indium precursor flow followed by Al, Ga, indium and ammonia flow or vice versa. This leads to formation of a second sublayer of $Al_xIn_yGa_{1-x-y}N$. Then the third step is deposition of a third $Al_cIn_dGa_{1-c-d}N$ sub layer by flowing Al, Ga, in the first step and Al, Ga, In and ammonia in the next step. The first superlattice is formed repeating the $Al_xIn_yGa_{1-x-y}N$ and $Al_cIn_dGa_{1-c-d}N$ for one time or multiple times. A nested superlattice is formed by depositing a first $Al_aIn_bGa_{1-a-b}N$ sub layer following the first superlattice of $Al_xIn_yGa_{1-x-y}N$ and $Al_cIn_dGa_{1-c-d}N$. The composition is adjusted such that the layer is within the cracking limit due to strain.

Figure 4:
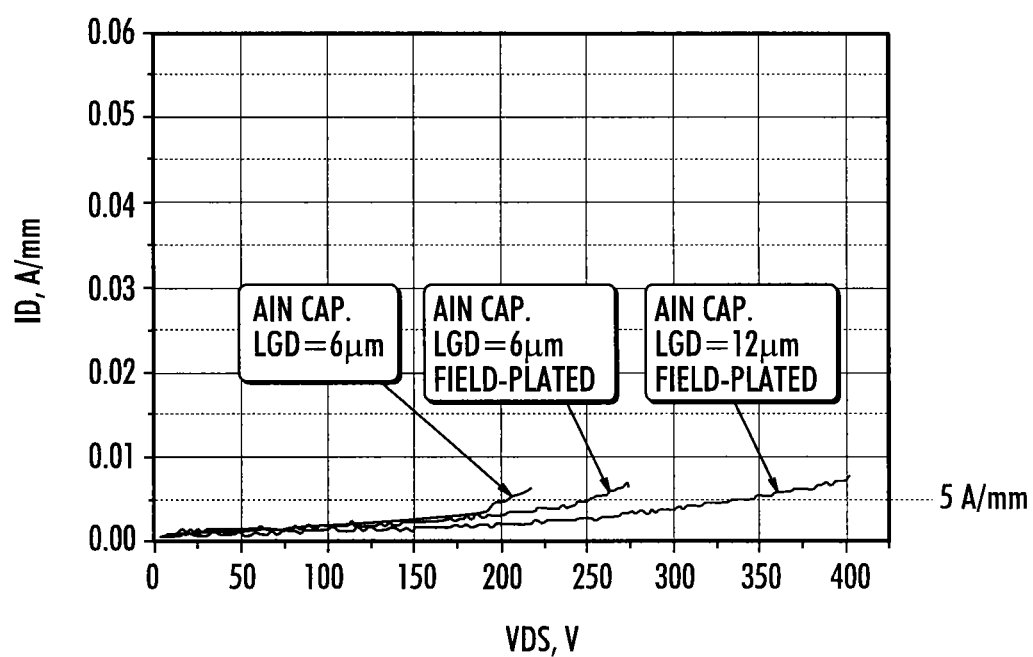
FIG. 4 is a graphical illustration of breakdown measurements.

Breakdown voltage for a AlInN-HEMT with an AlN cap layer and field plate geometry is provided in FIG. 4. In FIG. 4, Example 1 is an HEMT with an AlN cap and a gate to drain length of 6 μm. Example 2 is a field plated HEMT with an AlN cap and a gate to drain length of 6 μm. Example 3 is a field plated HEMT with an AlN cap and a gate to drain length of 12 μm.

The invention has been described with reference to the preferred embodiments without limit thereto. One of skill in the art would realize additional embodiments which are not specifically stated but which are within the teachings and claims appended hereto.

The invention claimed is:

1. A high breakdown voltage semiconductor device comprising:
   a substrate;
   a $Al_aGa_{1-a}N$ layer on said substrate wherein $0.1 \leq a \leq 1.00$;
   a GaN layer on said $Al_aGa_{1-a}N$ layer;
   a $In_{1-b}Ga_bN$/GaN channel layer on said GaN layer wherein $0.1 \leq b \leq 1.00$;
   an $Al_cIn_dGa_{1-c-d}N$ spacer layer on said $In_{1-b}Ga_bN$/GaN layer wherein $0.1 \leq c \leq 1.00$ and $0.0 \leq d \leq 0.99$;
   a $Al_eIn_{1-e}N$ nested superlattice barrier layer on said $Al_cIn_dGa_{1-c-d}N$ spacer layer wherein $0.10 \leq e \leq 0.99$;
   a $Al_fIn_gGa_{1-f-g}N$ leakage suppression layer over on said $Al_eIn_{1-e}N$ barrier layer wherein $0.1 \leq f \leq 0.99$ and $0.1 \leq g \leq 0.99$ wherein said leakage suppression layer decreases leakage current and increases breakdown voltage during high voltage operation; and
   a superstructure on said $Al_fIn_gGa_{1-f-g}N$ leakage suppression layer.

2. The semiconductor device of claim 1 wherein said superstructure comprises a source electrode, a drain electrode and a gate electrode.

3. The semiconductor device of claim 2 wherein said superstructure further comprises a functional layer.

4. The semiconductor of claim 3 further comprising at least one of a source electrode, a gate electrode or a drain electrode on said functional layer.

5. The semiconductor device of claim 3 further comprising a field plate formed on at least one of said source, drain and gate electrode.

6. The semiconductor device of claim 3 wherein said functional layer comprises at least one material selected from the group consisting of silicon dioxide, silicon nitride, benzocyclobutene, aluminium nitride, aluminum galium nitride, galium nitride, boron nitride, silicon carbide, diamond, aluminum oxide, magnesium oxide, hafnium oxide, zirconium oxide, scandium oxide, polytetrafluoroethylene, perfluoroalkoxy, fluorinated ethylene propylene, polystyrene, polyoxybenzylmethylenglycolanhydride, or combinations thereof.

7. The semiconductor device of claim 6 wherein said functional layer is a high dielectric insulator.

8. The semiconductor device as in claim 7 wherein said functional layer has a dielectric strength of at least 1 MV/m but no more than 100 MV/m.

9. The semiconductor device of claim 1 wherein said substrate is selected from the group consisting of sapphire, the substrate may be made of silicon carbide, GaN, AlN, AlGaN, InN, InGaN, AlInGaN, Silicon, GaAs, $LiAlO_3$, $LiGaO_3$, ZnO, and a metal.

10. The semiconductor device of claim 9 wherein said substrate is semi-insulating SiC.

11. The semiconductor device of claim 1 wherein $0.90 \leq a \leq 1.00$.

12. The semiconductor device of claim 1 wherein said a $Al_aGa_{1-a}N$ layer has a thickness of 10 Å-10 μm.

13. The semiconductor device of claim 1 wherein said GaN layer has a thickness of 10 Å-10 μm.

14. The semiconductor device of claim 1 wherein said $In_{1-b}Ga_bN$/GaN channel layer has a thickness of 10 Å-1000 Å.

15. The semiconductor device of claim 1 wherein $0.90 \leq c \leq 1.00$ and $0 \leq d \leq 0.10$.

16. The semiconductor device of claim 1 wherein said $Al_cIn_dGa_{1-c-d}N$ spacer has a thickness of at least 5 Å to no more than 100 Å.

17. The semiconductor device of claim 16 wherein said $Al_cIn_dGa_{1-c-d}N$ spacer has a thickness of at least 10 Å to no more than 20 Å.

18. The semiconductor device of claim 1 wherein said $Al_eIn_{1-e}N$ nested superlattice barrier layer has a thickness of at least 1 Å to no more than 1000 Å.

19. The semiconductor device of claim 1 wherein said $Al_eIn_{1-e}N$ nested superlattice barrier layer has a thickness of at least 30 Å to no more than 300 Å.

20. The semiconductor device of claim 1 wherein said nested superlattice barrier layer comprises sublayers.

21. The semiconductor device of claim 20 wherein said sublayers comprise alternating AlN/InN layers.

22. The semiconductor device of claim 21 wherein each AlN layer has a thickness of at least 1 Å to no more than 500 Å.

23. The semiconductor device of claim 22 wherein each AlN layer has a thickness of 1 Å to 100 Å.

24. The semiconductor device of claim 23 wherein each AlN layer has a thickness of 1 Å to 20 Å.

25. The semiconductor device of claim 21 wherein each InN layer has a thickness of 1 Å to 500 Å.

26. The semiconductor device of claim 25 wherein each InN layer has a thickness of 1 Å to 100 Å.

27. The semiconductor device of claim 26 wherein each InN layer has a thickness of 1 Å to 20 Å.

28. The semiconductor device of claim 20 wherein adjacent AlN layers have different compositions.

29. The semiconductor device of claim 18 wherein said $Al_eIn_{1-e}N$ nested superlattice barrier layer comprises individual or multi-stacks of Al/N/In/N atomic layers.

30. The semiconductor device of claim 29 wherein said individual or multi-stacks of Al/N/In/N atomic layers each have a thickness of 1 Å-20 Å.

31. The semiconductor device of claim 1 wherein $0.6 \leq e \leq 0.99$.

32. The semiconductor device of claim 1 wherein said $Al_fIn_gGa_{1-f-g}N$ leakage suppression layer has a thickness of at least 1 Å to no more than 200 Å.

33. The semiconductor device of claim 1 wherein said nested superlattice barrier layer is an AlInN nested superlattice barrier layer and said leakage suppression layer is selected from a single layer and multistack layers with each multistack layer of said multistack layers selected from AlN, GaN, AlGaN, InGaN, AlInGaN and AlGaN layer.

34. The semiconductor device of claim 33 wherein leakage suppression layer is selected from undoped and doped with silicon.

35. The semiconductor device of claim 1 where the electron mobility is at least 300 cm$^2$/vs to 3000 cm$^2$/vs and the sheet carrier density of 0.1-4.0×10$^{13}$ cm$^{-2}$.

36. The semiconductor device of claim 1 with a sheet resistance of ranging between 10-1000 ohm/sq.

37. The semiconductor device of claim 1 wherein the breakdown voltage is between 300V to 100 KV.

38. A method for forming a semiconductor device comprising the steps of:
providing a substrate;
depositing a $Al_aGa_{1-a}N$ layer on said substrate wherein $0.1 \leq a \leq 1.00$;
depositing a GaN layer on said $Al_aGa_{1-a}N$ layer;
depositing a $In_{1-b}Ga_bN$/GaN channel layer on said GaN layer wherein $0.1 \leq b \leq 1.00$;
depositing a $Al_cIn_dGa_{1-c-d}N$ spacer layer on said $In_{1-b}Ga_bN$/GaN layer wherein $0.1 \leq c \leq 1.00$ and $0 \leq d \leq 0.99$;
depositing a $Al_eIn_{1-e}N$ nested superlattice barrier layer on said $Al_cIn_dGa_{1-c-d}N$ spacer layer wherein $0.10 \leq e \leq 0.99$;
depositing a $Al_fIn_gGa_{1-f-g}N$ leakage suppression layer on said $Al_eIn_{1-e}N$ barrier layer wherein $0.1 \leq f \leq 0.99$ and $0.1 \leq g \leq 0.99$;
depositing at least one layer selected from said $Al_aGa_{1-a}N$ layer; said GaN layer, said $In_{1-b}Ga_bN$/GaN channel layer; said $Al_eIn_{1-e}N$ nested superlattice barrier layer and said $Al_fIn_gGa_{1-f-g}N$ leakage suppression layer by a pulsed metalorganic chemical vapor deposition technique; and a superstructure on said $Al_fIn_gGa_{1-f-g}N$ leakage suppression layer.

39. The method for forming a semiconductor device of claim 38 wherein said superstructure comprises a source, a drain and a gate.

40. The method for forming a semiconductor device of claim 39 further comprising a field electrode on at least one of said source, said drain or said gate.

41. The method for forming a semiconductor device of claim 39 wherein said functional layer is a dielectric.

42. The method for forming a semiconductor device of claim 39 wherein said superstructure further comprises a functional layer.

43. The method for forming a semiconductor device of claim 42 wherein said functional layer is an insulator.

44. The method for forming a semiconductor device of claim 42 wherein at least one of said source said drain or said gate is on said functional layer.

45. The method for forming a semiconductor device of claim 42 wherein said functional layer comprises at least one material selected from the group consisting of silicon dioxide, silicon nitride, benzocyclobutene, aluminium nitride, aluminum galium nitride, galium nitride, boron nitride, silicon carbide, diamond, aluminum oxide, magnesium oxide, hafnium oxide, zirconium oxide, scandium oxide, polytetrafluoroethylene, perfluoroalkoxy, fluorinated ethylene propylene, polystyrene, polyoxybenzylmethylenglycolanhydride, or combinations thereof.

46. The method for forming a semiconductor device of claim 5 wherein said functional layer is a high dielectric insulator.

47. The method for forming a semiconductor device of claim 38 wherein $0.90 \leq a \leq 1.00$.

48. The method for forming a semiconductor device of claim 46 wherein said functional layer has a dielectric strength of at least 1 MV/m but no more than 100 MV/m.

49. The method for forming a semiconductor device of claim 38 wherein said substrate is selected from the group consisting of sapphire, the substrate may be made of silicon carbide, GaN, AlN, AlGaN, InN, InGaN, AlInGaN, Silicon, GaAs, LiAlO$_3$, LiGaO$_3$, ZnO, and a metal.

50. The method for forming a semiconductor device of claim 49 wherein said substrate is silicon carbide substrate.

51. The method for forming a semiconductor device of claim 38 wherein $0.90 \leq c \leq 1.00$ and $0.0 \leq d \leq 1.00$.

52. The method for forming a semiconductor device of claim 38 wherein said a $Al_aGa_{1-a}N$ layer has a thickness of at least 10 Å to no more than 1.0 μm.

53. The method for forming a semiconductor device of claim 38 wherein said GaN layer has a thickness of at least 10 Å to no more than 10 μm.

54. The method for forming a semiconductor device of claim 38 wherein said $In_{1-b}Ga_bN$/GaN channel layer has a thickness of at least 10 Å to no more than 1000 Å.

55. The method for forming a semiconductor device of claim 38 wherein said $Al_cIn_dGa_{1-c-d}N$ spacer has a thickness of at least 5 Å to no more than 100 Å.

56. The method for forming a semiconductor device of claim 55 wherein said $Al_cIn_dGa_{1-c-d}N$ spacer has a thickness of at least 10 Å to no more than 20 Å.

57. The method for forming a semiconductor device of claim 38 wherein $Al_eIn_{1-e}N$ nested superlattice barrier layer has a thickness of at least 1 Å to no more than 1000 Å.

58. The method for forming a semiconductor device of claim 57 wherein said $Al_eIn_{1-e}N$ nested superlattice barrier layer has a thickness of at least 30 Å to no more than 300 Å.

59. The method for forming a semiconductor device of claim 38 wherein said $Al_eIn_{1-e}N$ nested superlattice barrier layer comprising alternating AlN/InN layers.

60. The method for forming a semiconductor device of claim 59 wherein each AlN layer has a thickness of 1 Å to 500 Å.

61. The method for forming a semiconductor device of claim 60 wherein each AlN layer has a thickness of 1 Å to 100 Å.

62. The method for forming a semiconductor device of claim 61 wherein each AlN layer has a thickness of 1 Å to 20 Å.

63. The method for forming a semiconductor device of claim 59 wherein each InN layer has a thickness of 1 Å to 500 Å.

64. The method for forming a semiconductor device of claim 63 wherein each InN layer has a thickness of 1 Å to 100 Å.

65. The method for forming a semiconductor device of claim 64 wherein each InN layer has a thickness of 1 Å to 20 Å.

66. The method for forming a semiconductor device of claim 38 wherein said $Al_eIn_{1-e}N$ nested superlattice barrier layer comprises individual or multi-stacks of Al/N/In/N atomic layers.

67. The method for forming a semiconductor device of claim 66 wherein said individual or multi-stacks of Al/N/In/N atomic layers each have a thickness of 1 Å-20 Å.

68. The method for forming a semiconductor device of claim 38 wherein $0.65 \leq e \leq 0.99$.

69. The method for forming a semiconductor device of claim 38 wherein said $Al_fIn_gGa_{1-f-g}N$ leakage suppression layer has a thickness of at least 1 Å to no more than 200 Å.

70. The method of forming a semiconductor device of claim 38 wherein at least one layer is formed by a technique selected from metalorganic chemical vapor deposition, hydride vapor phase epitaxy, pulsed atomic layer epitaxy, rapid pulsed lateral overgrowth epitaxy, molecular beam epitaxy, metalorganic hydride vapor phase epitaxy and flow modulation technique.

71. The method for forming a semiconductor device of claim 38 where the electron mobility is at least 300 cm$^2$/vs to 3000 cm$^2$/vs and the sheet carrier density of $0.1$-$4.0 \times 10^{13}$ cm$^{-2}$.

72. The method for forming a semiconductor device of claim 38 with a sheet resistance of ranging between 10-1000 ohm/sq.

73. The method for forming a semiconductor device of claim 38 wherein the breakdown voltage is between 300V to 100 KV.

* * * * *